United States Patent [19]

Lockwood et al.

[11] Patent Number: 4,905,239

[45] Date of Patent: Feb. 27, 1990

[54] R. F. SIGNAL DISTRIBUTION

[75] Inventors: Andrew S. Lockwood; Richard J. Barnett, both of Stevenage, United Kingdom

[73] Assignee: British Aerospace Public Limited Company, London, England

[21] Appl. No.: 172,785

[22] Filed: Mar. 28, 1988

[30] Foreign Application Priority Data

Mar. 26, 1987 [GB] United Kingdom ............... 8707260
Sep. 10, 1987 [GB] United Kingdom ............... 8721287

[51] Int. Cl.$^4$ ............................................. H04J 1/10
[52] U.S. Cl. ..................................... 370/123; 333/110
[58] Field of Search ........................... 370/72, 75, 123; 333/109, 110

[56] References Cited

U.S. PATENT DOCUMENTS

| 4,029,902 | 6/1977 | Bell, Jr. et al. | 370/123 |
| 4,426,630 | 1/1984 | Folkmann | 333/110 |
| 4,706,239 | 11/1987 | Ito et al. | 370/75 |
| 4,815,075 | 3/1989 | Cameron | 370/123 |

Primary Examiner—Douglas W. Olms
Assistant Examiner—Melvin Marcelo
Attorney, Agent, or Firm—Nixon & Vanderhye

[57] ABSTRACT

Apparatus for transferring RF signals between a plurality of inputs and a plurality of outputs comprises a plurality of output multiplexers $30_1 \ldots 30_{10}$, each made up of a plurality of hybrid/tunable filter combinations $21_1 \ldots 21_8$. The RF signal inputs of the apparatus are supplied to one output multiplexer $30_1$ and the inputs of each output multiplexers are connected to the inputs of the adjacent multiplexer, such that a signal not transmitted by one output multiplexer will be passed to a next output multiplexer, and so on. By appropriate tuning of the filters 24 in the output and multiplexers the RF signals may be reconfigurably distributed between the inputs and the outputs, and, the need for switching is avoided while maintaining an acceptably low path loss.

10 Claims, 3 Drawing Sheets

R. F. SIGNAL DISTRIBUTION

BACKGROUND OF THE INVENTION

This invention relates to apparatus for transferring RF signals between a plurality of RF signal inputs and a plurality of outputs, and more particularly, but not exclusively for transferring RF signals from a series of broadcast channels on a direct broadcast satellite to a series of transmitting antennas.

It may be required to use a direct broadcast satellite to broadcast a large number of T.V. channels (say 10) to a number of different coverage areas. It may not be known before launch which channels are to be directed over which coverage areas and it may be necessary to change the routing configuration between the channels and the transmitting antennas during the lifetime of the satellite. The principle of providing a direct broadcast satellite which may be reconfigured in this manner is known, but there have been no proposals as to how such a system might be constructed. In the specific description there is outlined a method proposed by the Applicants and using conventional approaches whereby a reconfigurable system could be provided using a switching network. Because such a system would require many switches to set up the required routing configurations, the system would be heavy, require many telecommand and telemetry lines and would have a substantial path loss for each route between input and output.

BRIEF SUMMARY OF THE INVENTION

According to the present invention, there is provided apparatus for transferring RF signals between a plurality of inputs and a plurality of outputs of the system and comprising a plurality of multiplexing circuits each made up of a plurality of interconnected hybrid/tunable filter combinations, the multiplexing circuits being interconnected one with another and with said inputs to the outputs.

In the embodiment of the invention disclosed herein the distribution of the RF signals is achieved by suitable setting of the filters in the hybrid/tunable filter combinations and the need for switches to route the RF signals is avoided.

BRIEF DESCRIPTION OF THE SEVERAL VIEWS OF THE DRAWING

The invention will now be described by way of example, reference being made to the accompanying drawings in which.

DETAILED DESCRIPTION

Figure 1:
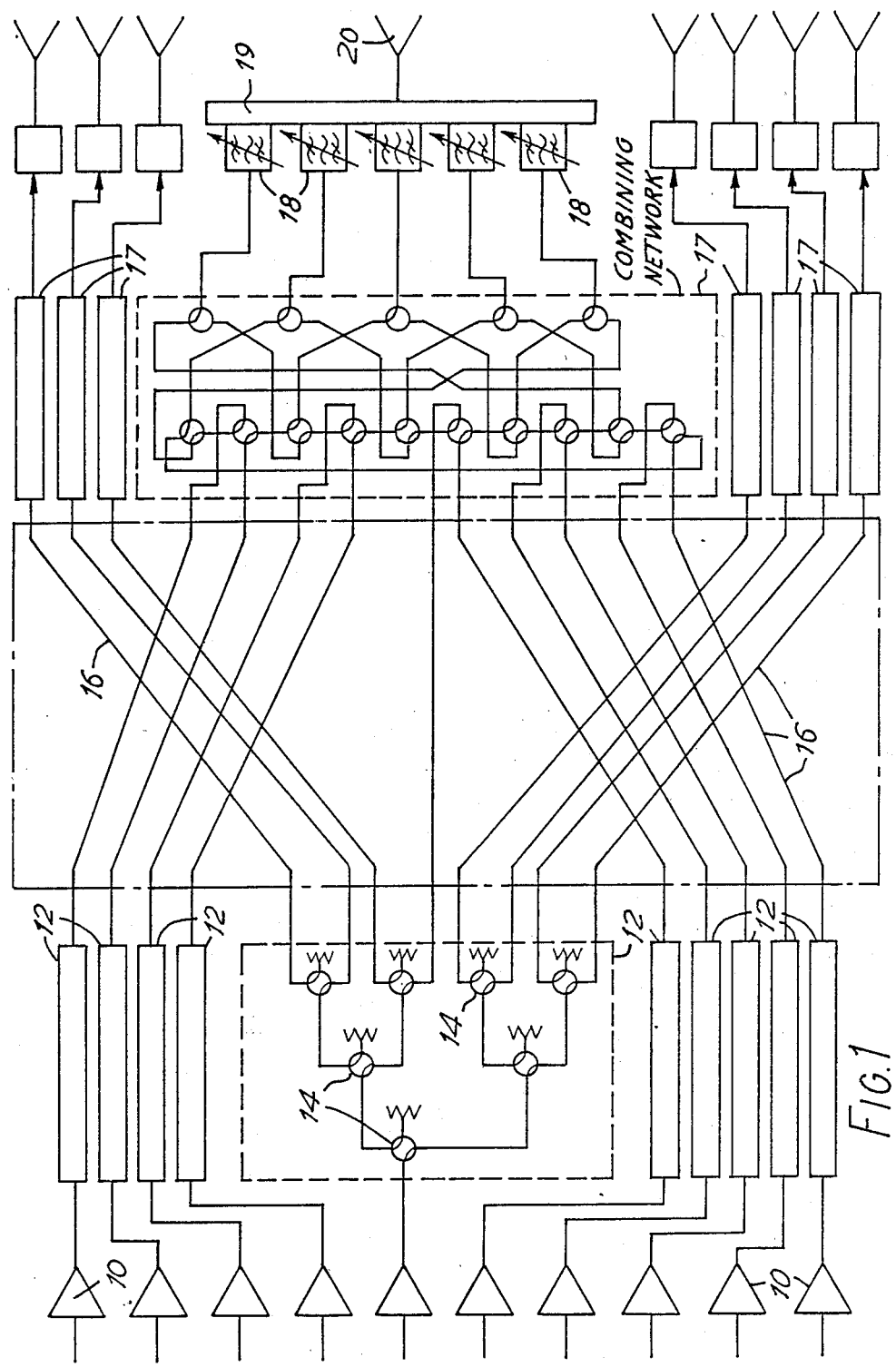
FIG. 1 is a diagram representing the switching requirements in a first arrangement proposed by the Applicants.

FIG. 1 is a diagram representing the switching requirements for providing switching between ten channels and eight OMUX's (output multiplexers). It can be shown that with these numbers it is possible to generate a total of $8^{10}$ different routing configurations. The flexibility required could be met by using switches or hybrid couplers to provide a dividing network configuration. In the output section, minimising power loss is of importance, and the arrangement illustrated in FIG. 1 therefore uses switches, since hybrid couplers halve the power at each pass. In the situation for which the arrangement of FIG. 1 is intended, it will not be possible to use a conventional design OMUX due to the large number of output channels to be combined and thus other methods must be used. Also, for a reconfigurable system, it will be necessary to use tunable filters in the OMUX and therefore a conventional manifold system is not appropriate.

In the system of FIG. 1, one channel can only go to one beam at a time and each beam cannot receive more than five channels.

The input signal to each channel is amplified in a travelling wave tube 10 and then supplied to a switching network 12, only one of which is shown in detail in FIG. 1. Each switching network comprises seven switches 14 arranged to allow the input to be switched to any one of eight outputs. Each of the eight outputs is passed into an array of eighty waveguide interconnections 16 to pass to the appropriate combining network 17 as selected by the switching network 12. Only one combining network is shown in detail. Each of the combining networks 17 supplies the signals via a tunable filter 18 to an OMUX 19 which feeds the antenna subsystem 20. The network shown has a built-in redundancy.

The network of FIG. 1 would require 190 switches and 250 waveguide interconnections. Assuming a switch mass of 0.6 Kg, the mass of the interconnecting and switching network would be approximately 200 Kg. The path loss per channel of the system would be, to a rough estimation, about 4 dB. The system illustrated would require 360 telecommand lines and 360 telemetry lines.

In order to avoid the penalties associated with the mass of the system of FIG. 1, its high number of command and telemetry lines, and the losses associated with each path, the Applicants have conceived a system which employs a plurality of multiplexing circuits each made up of a plurality of interconnected hybrid/tunable filter combinations. The multiplexing circuits are interconnected to allow RF signals received at the inputs to be reconfigurably distributed between the outputs by tuning of selected filters.

In the following description, embodiments of the hybrid/tunable filter combination, the multiplexing circuit and the overall distribution system will be described in turn, with reference to FIGS. 2, 3 and 4 respectively.

Figure 2:
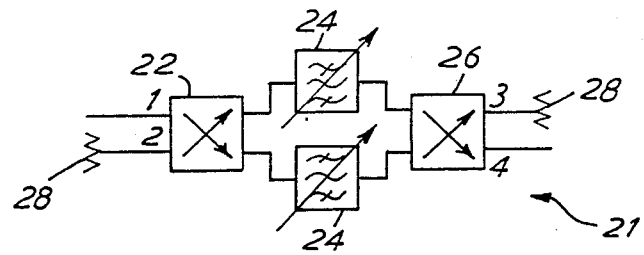
FIG. 2 is a schematic diagram of a hybrid/tunable filter combination for use in the output multiplexer of FIG. 3.
Figure 3:
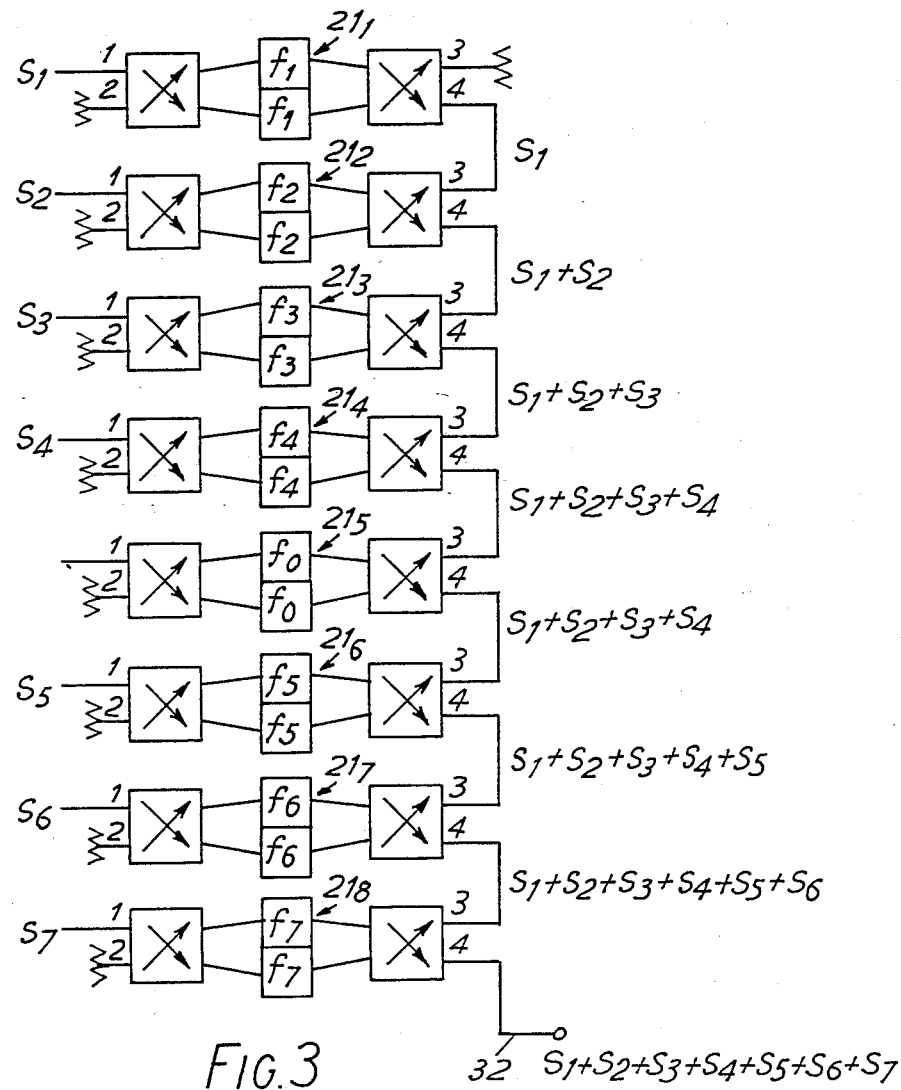
FIG. 3 is a schematic diagram of an output multiplexer made up of a plurality of the combinations of FIG. 3.

Referring to FIG. 2, there is shown a single hybrid/tunable filter combination 21 which, when cascaded with other similar elements, forms the output multiplexer of FIG. 3.

The combination comprises an input hybrid coupler 22 including inlet ports 1 and 2, the outputs of the hybrid coupler being supplied to respective tunable band pass filters 24 each set at the same centre frequency f, and bandwidth. The outputs from the filters 24 are passed to the input ports of a further hybrid coupler 26 having output ports 3 and 4. As will be understood by those skilled in the art, each coupler 22, 26 is formed as two lengths of waveguide arranged side-by-side with a communicating aperture. Each coupler has the property that a signal supplied to a port results in two signals at the opposed outlet ports of substantially equal amplitude but at phases of 0 (at the aligned port) and −90/2 (at the non-aligned port). Thus if a signal within the bandwidth set by the filters 24 is supplied to the input port 1 of the hybrid coupler 10, the signal will be transmitted to output port 4 of the coupler 26. Similarly, a matched signal supplied to port 2 would be transmitted to port 3. In other words, a signal within the bandwidth of the filters, supplied to any port of the device will pass to the port diagonally opposite the entry port. In the description below, when a signal is said to be matched to the filters of a combination, it is intended to signify that the signal is within the bandwidth of the filters and thus will pass diagonally through the combination.

The tunable filters 24 are of a type which transmits frequencies within the filter bandwidth but reflects frequencies outside the bandwidth. If an out-of-band signal is suppled to a port of the combination 21, the signal will be reflected out of the other port of the same hybrid coupler. For example an out-of-band signal supplied to port 1 will be reflected by the filters 24 to pass to port 2, thence into a high power load 28.

In FIG. 3, eight of the combinations $21_1 \ldots 21_8$ of FIG. 1 are cascaded together by connecting port 4 of each combination $21_n$ to port 3 of the adjacent combination $21_{n+1}$ to form a tunable OMUX 30. In such an arrangement, the filters of each combination are tuned to respective exclusive bandwidths $f_1 \ldots f_7$, and, in this embodiment, the filters of combination $21_5$ are tuned out of band for reasons to be discussed below. Thus a signal $S_1$ applied to the input port 1 of the first combination $21_1$ and having a frequency within bandwidth $f_1$, will be transmitted through the element to port 4, whence it will be passed by the cascade connections to port 3 of the next combination $21_2$. However, since the filters of the next combination are tuned to a different bandwidth $f_2$ the signal $S_1$ will be out of band and thus reflected by the filter $f_2$ and will pass out of port 4 of combination $21_2$. The signal $S_2$ applied to port 1 of the combination $21_2$ will pass diagonally through the combination to pass through port 4 of the combination (assuming that signal $S_2$ is within the bandwidth $f_2$). Thus, as indicated in FIG. 3, the cascaded combinations together act as a tunable OMUX 30 having an output 32 from port 4 of combination $21_8$. If there is no input to a combination, e.g. at combination $21_5$, then the filters 24 of the element are tuned out of band (frequency fo) to ensure that all the signal input at port 3 is reflected out of port 4. Thus the OMUX can incorporate redundant combinations such as combination $21_5$ which can be brought into operation and shut off as required by appropriate setting of the filters of the combination.

An OMUX similar to that of FIG. 3 but with ten combinations 21 cascaded could be used to replace the combining network 17 and associated tunable filters 18 and OMUXs 19 of the arrangement of FIG. 1. The arrangement of FIG. 1 would require eight OMUXs 30, and the outputs from the travelling wave tubes 10 would still have to be routed to each OMUX. This would require seventy switches and eighty associated waveguide interconnections.

Figure 4:
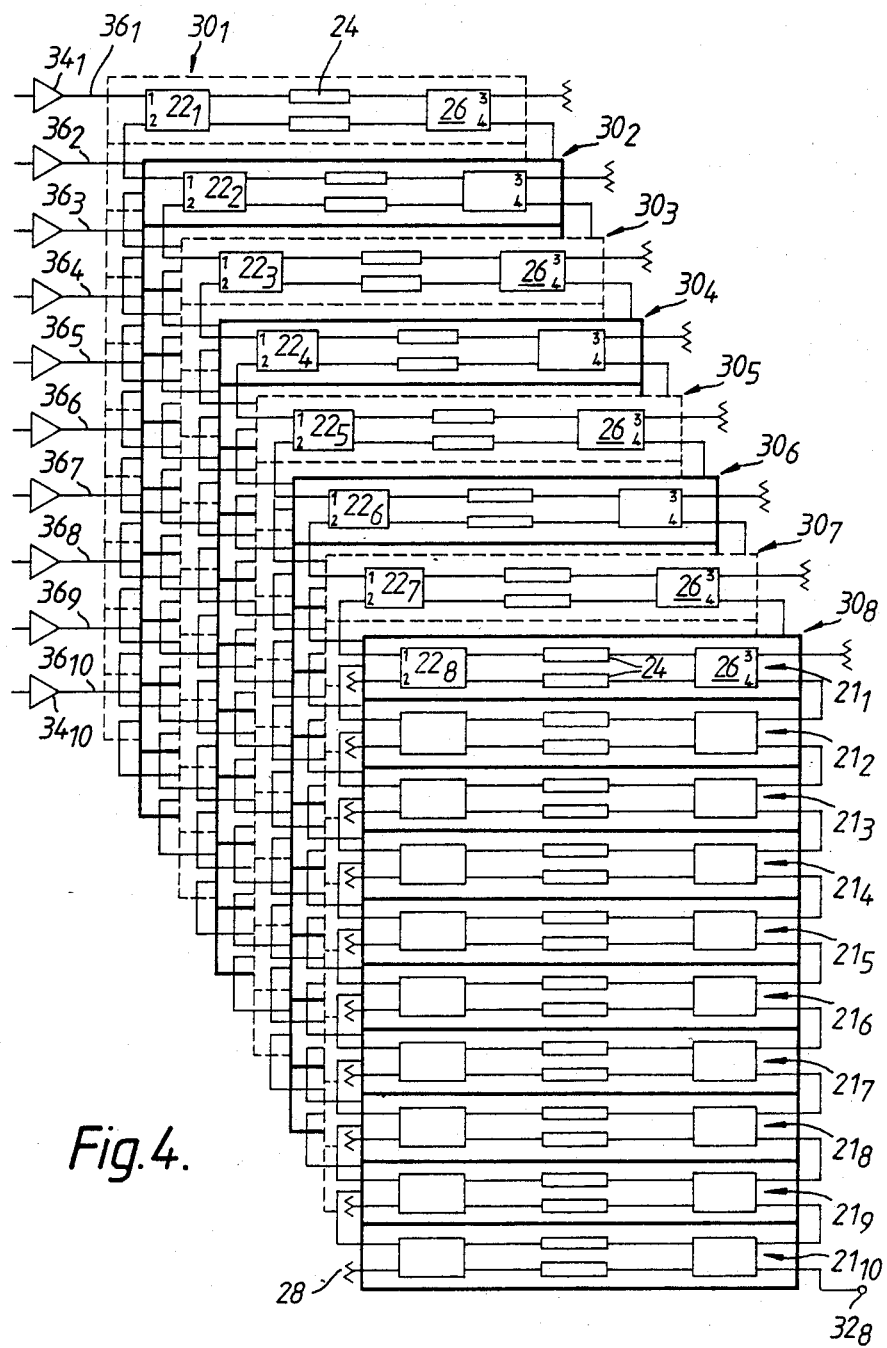
FIG. 4 is a schematic diagram showing a RF distribution apparatus according to an embodiment of this invention.

The Applicants have designed an apparatus—illustrated in FIG. 4—in which the requirement for the switches can be removed. In this arrangement, eight tunable OMUXs $30_1 \ldots 30_8$ of the type shown in FIG. 3 but each comprising ten combinations 21 cascaded together are interconnected as to be described below. Each channel input signal is amplified by a travelling wave tube 34 and then supplied via inputs $36_1 \ldots 36_{10}$ to port 1 of the input hybrid coupler 22 of a respective combination $21_1 \ldots 21_{10}$ in OMUX $30_1$. For a given OMUX 30, each pair of filters 24 in each combination $21_1 \ldots 21_n$ is tuned to a respective exclusive bandwidth. The pairs of filters in a given combination in each of the OMUXs are associated with the same bandwidth. That is to say, for a given combination in each of the OMUXs, the pairs of filters are either matched to a given bandwidth or tuned out of band of all of the remaining filters in all of the OMUXs.

The OMUXs $30_1$ to $30_8$ are interconnected by connecting port 2 of the input hybrid coupler 22 of a combination $21_m$ in an OMUX $30_n$ to port 1 of the corresponding combination $21_m$ in the adjacent OMUX $30_{n+1}$. Thus, in the array of interconnected OMUXs 30, the combinations $21_m$ are interconnected at their input ends to corresponding combinations $21_m$ in adjacent OMUX's, to form interconnected rows.

A signal input at an input $36_m$ will be applied to each combination $21_m$ in turn until it reaches a combination containing filters matched to the signal. Thereupon it will be transmitted by the appropriate combination to pass to the outlet 32 of the OMUX containing that combination. At their output ends, the combinations $21_m$ are interconnected with adjacent combinations $21_{m+1}$ in the same OMUX to form interconnected columns as described before in relation to FIG. 3. As in the OMUX of FIG. 3, port 4 of the final combination $21_{10}$ in the cascade of each OMUX $30_1 \ldots 30_8$ forms the output $32_1 \ldots 32_8$ and is connected to the respective antenna subsystem (not shown). The references to rows and columns are used in relation to the arrangement shown in FIG. 4 for the purposes of explanation only and are not intended to imply a particular structural limitation.

Each OMUX 30 thus comprises ten pairs of tunable filters each tuned to a respective exclusive frequency bandwidth, and thus an arrangement of eight OMUXs includes eighty pairs of tunable filters. As described above in relation to FIG. 2, in each pair, the filters are adjusted to have the same centre frequency and bandwidth.

The pairs of filters are adjusted in accordance with the configuration requirements. For example, assume that the signal on input $36_1$ is to be routed to output $32_1$. This is achieved by ensuring that the filters in combination $21_1$ of OMUX $30_1$ are tuned so that they are matched to the signal on input $36_1$ so that the signal passes through combination $21_1$ of the first OMUX to reach output $32_1$.

If it is wished to route, say, input $36_2$ to output $32_5$, then it is necessary to arrange that the filters in combinations $21_2$ of OMUXs $30_1$ to $30_4$ are not matched to input $36_2$, but that the filter in combination $21_2$ of OMUX $30_5$ is matched to this input. In this way, the signal $36_2$ will be reflected at successive OMUXs until it reaches OMUX $30_5$ where it will pass through combination $21_2$ to reach $32_5$.

The arrangement of FIG. 4 may be thought of in terms of a matrix of order 10x8 in which the rows represent the input channels and the columns represent the outputs to the antenna subsystems. In such a matrix the matrix elements $a_{xy}$ represent whether the filters in the combination $21_x$ of OMUX $30_y$ are matched to the frequency input on input $36_x$ and thus whether the signal input on input $36_x$ will be passed to this outlet $32_y$ of OMUX $30_y$. From a consideration of the operation of the arrangement of FIG. 4, it will be appreciated that an input signal cannot be routed to more than one output in the illustrated embodiment.

In this system it is possible to route the input signals to any one of the output beams by appropriate adjustment of the pairs of filters in the OMUXs 30, and there is no requirement for the switches of the arrangement of FIG. 1. There will thus be a considerable saving in terms of both cost and mass. Also, it will not be necessary to provide 720 control lines.

The path loss for each route between the input and output will vary depending on the position of the combination 21 within the OMUX and the position of the OMUX in the output network. For example the losses in the route between input $36_{10}$ and output $32_1$ will be much less than the losses in the route between input $36_1$ and output $36_8$. Channels or beams requiring a particularly high EIRP may be positioned in the network accordingly to minimise path loss. For a system connecting ten channels to eight beams, the path loss will vary from about 0.3 dB to 5 dB depending on the routing. For the system of FIG. 1, the path loss will be about 4 dB for all routes.

The arrangement illustrated in FIG. 4 may also be operated to provide a distribution system for distributing a further set of inputs between a further set of outputs. From FIG. 4 it will be seen that the input ports 2 of each of the input hybrid couplers in OMUX $30_8$ are shown connected to a high power load 28. However, these ports may form the inputs $36^1{}_1 \ldots 36^1{}_{10}$ of another distribution system having outlets on each OMUX $30_1 \ldots 30_8$ formed by the output port 3 of each output hybrid coupler 26 in combination $21_1$ of each OMUX. It will however be appreciated that the routing configuration of both the first and second systems will be dependent in the setting of the filters, and thus that the routing configuration of one system may not be varied independently of that for the other system.

We claim:

1. Apparatus for distributing a plurality of signals between N input means and M output means, said apparatus comprising:
   a series of M multiplexing circuits, each circuit including N tunable filter/coupler combinations, one of said N combinations associated with a respective one of said N input means, and said N combinations having their outputs connected in cascade fashion comprising a means for supplying signals passed by said combination to a multiplexer output means which forms a respective one of said M output means:
   means for controlling the transmission characteristics of each of said tunable filter/coupler combinations and for selectively passing a signal applied thereto: and
   means for interconnecting said multiplexing circuits, said interconnecting means being capable of providing a signal path between each tunable filter/coupler combination and an associated one of said N input means, whereby a signal supplied to one of said N input means may be distributed to a selected one of said M output means by appropriate control of the transmission characteristics of the filter/coupler combinations associated with said input terminal.

2. Apparatus according to claim 1, wherein the multiplexers are interconnected in series such that a signal supplied to an N filter/coupler combination and not passed thereby is supplied to the N filter/coupler combination in the next multiplexer in the series.

3. Apparatus according to claim 1, wherein each tunable filter/coupler combination in a multiplexer includes tunable reflectance filter means and wherein a signal transmitted by said filter means is passed to said multiplexer output means.

4. Apparatus according to claim 3, wherein each tunable filter/coupler combination includes two hybrid coupler means interconnected by tunable reflectance filter means and said combination defines a first port for receiving a signal, a second port for outputting a signal having been input via said first port and reflected by said reflectance filter, a third port for receiving a further signal and a fourth port for outputting at least one of a signal having been input via said first port and transmitted by said filter and a signal having been input via said third port and reflected by said filter.

5. Apparatus for distributing a plurality of signals between N input means and M output means of the apparatus, said apparatus including:
   M multiplexing circuits in series, each circuit having an output means forming a respective one of said M output means of said apparatus, and each circuit including N tunable filter/coupler combinations wherein each of said N tunable filter/coupler combinations includes:
   a tunable reflectance filter;
   a first port for being in signal communication with a respective one of said N input means;
   a second port for outputting a signal or component thereof having been input via said first port and reflected by said tunable reflectance filter;
   a third port for inputting a signal; and
   a fourth port for outputting at least one of a signal having been input via said first port and transmitted by said tunable reflectance filter and a signal having been input via said third port and reflected by said reflectance filter;
   means, associated with each of said M multiplexing circuits, for passing the signals output by the fourth port of the last tunable filter/coupler combinations making up the multiplexing circuit to a respective M output means; and
   means for passing the signals output from the second ports of each of the tunable filter/coupler combinations of a given multiplexing circuit to the first ports of the corresponding tunable filter/coupler combinations of a next succeeding multiplexing circuit.

6. Apparatus for distributing a plurality of signals between N input means and M output means of the apparatus, said apparatus including M multiplexing circuits in series, each circuit having an output means forming a respective one of said M output means of the apparatus and each circuit including N tunable filter/coupler combinations, wherein each of said N tunable filter/coupler combinations includes:
   input port means for being in signal communication with a respective one of said N input means of the apparatus;
   means for supplying signals passed by said tunable filter/coupler combinations to the output means of the associated multiplexing circuit; and means for selectively adjusting the reflectance characteristics of the tunable filter/coupler combination, whereby the signals supplied to said input means may be reconfigurably distributed to one or more selected output means.

7. A method of reconfigurably distributing N input signals between M output means which comprises supplying said N input signals to distribution apparatus which includes M multiplexing circuits each including N tunable filter/coupler combinations, each of said combinations being controllable selectively to pass a signal applied thereto and each multiplexing circuit having a respective output means to which signals passed by the filter/coupler combinations are supplied, comprising the steps of:
   applying each of said N input signals to a respective tunable filter/coupler combination on a first one of said M multiplexing circuits;
   supplying any signal not passed by a given tunable filter/coupler combination to a respective filter/coupler combination on one of the remaining multiplexing circuits; and
   controlling the transmission characteristics of each of said tunable filter/coupler combinations to effect a desired distribution of said N input signals.

8. A method according to claim 7, wherein any signal not passed by a given filter/coupler combination is supplied to a respective filter/coupler combination input on each of the remaining multiplexing circuits in turn until one of said filter/coupler combinations passes said signal.

9. Apparatus for distributing a plurality of signals between N input means and M output means, said apparatus comprising:
   a series of M multiplexing circuits, each circuit including N tunable filter/coupler combinations, one of said N combinations associated with a respective one of said N input means, and said N combinations having their outputs connected in cascade fashion comprising a means for supplying signals passed by said combination to a multiplexer output means which forms a respective one of said M output means:
   means for controlling the transmission characteristics of each of said tunable filter/coupler combinations and for selectively passing a signal applied thereto: and
   means for interconnecting said multiplexing circuits, said interconnecting means being capable of providing a signal path between each tunable filter/coupler combination and an associated one of said N input means, whereby a signal supplied to one of said N input means may be distributed to a selected one of said M output means by appropriate control of the transmission characteristics of the filter/coupler combinations associated with said input terminal, wherein each tunable filter/coupler combination includes two hybrid coupler means interconnected by tunable reflectance filter means and said combination defines a first port for receiving a signal, a second port for outputting a signal having been input via said first port and reflected by said reflectance filter, a third port for receiving a further signal and a fourth port for outputting at least one of a signal having been input via said first port and transmitted by said filter and a signal having been input via said third port and reflected by said filter.

10. Apparatus according to claim 9, wherein said reflectance filter means comprises two tunable filter means each interconnecting said hybrid coupler means and each controlled to have substantially the same transmission characteristics.

* * * * *